United States Patent [19]

Arao et al.

[11] Patent Number: 5,244,509

[45] Date of Patent: Sep. 14, 1993

[54] SUBSTRATE HAVING AN UNEVEN SURFACE FOR SOLAR CELL AND A SOLAR CELL PROVIDED WITH SAID SUBSTRATE

[75] Inventors: Kozo Arao; Yasushi Fujioka; Mitsuyuki Niwa; Eiji Takeuchi, all of Nagahama, Japan

[73] Assignee: Canon Kabushiki Kaisha, Tokyo, Japan

[21] Appl. No.: 741,734

[22] Filed: Aug. 7, 1991

[30] Foreign Application Priority Data

Aug. 9, 1990 [JP] Japan .................................. 212307

[51] Int. Cl.$^5$ .................. H01L 31/04; H01L 31/0236
[52] U.S. Cl. ..................................... 136/259; 136/246; 136/256; 136/258; 257/436; 428/612; 428/627; 428/632; 428/156
[58] Field of Search ............... 136/256, 258 AM, 259, 136/246; 357/30 J, 30 K, 30 L, 30 Q, 65, 67-68; 428/156, 612, 627, 632; 257/436

[56] References Cited

U.S. PATENT DOCUMENTS

| | | | |
|---|---|---|---|
| 4,126,150 | 11/1978 | Bell et al. | 136/255 |
| 4,328,390 | 5/1982 | Meakin et al. | 136/259 |
| 4,497,974 | 2/1985 | Deckman et al. | 136/259 |
| 4,554,727 | 11/1985 | Deckman et al. | 437/2 |
| 4,571,448 | 2/1986 | Barnett | 136/259 |

FOREIGN PATENT DOCUMENTS

| | | | |
|---|---|---|---|
| 59-153588 | 12/1979 | Japan | 428/611 |
| 56-69875 | 6/1981 | Japan | 136/255 |
| 56-152276 | 11/1981 | Japan | 136/255 |
| 58-35988 | 3/1983 | Japan | 136/258 AM |
| 58-159383 | 9/1983 | Japan | 136/259 |
| 58-180069 | 10/1983 | Japan | 136/256 |
| 59-14682 | 1/1984 | Japan | 136/258 AM |
| 59-82778 | 5/1984 | Japan | 136/259 |
| 59-104185 | 6/1984 | Japan | 136/259 |
| 59-154081 | 9/1984 | Japan | 136/259 |
| 59-213174 | 12/1984 | Japan | 136/256 |
| 60-84888 | 5/1985 | Japan | 357/30 |
| 60-257183 | 12/1985 | Japan | 136/259 |
| 62-45079 | 2/1987 | Japan | 136/256 |
| 62-122179 | 6/1987 | Japan | 136/259 |

OTHER PUBLICATIONS

D. E. Carlson et al., "Thick Cermet Films as Back Contacts", *Amorphous-Silicon Solar Cells*, Final Report for Jul. 1, 1976–Sep. 30, 1978, U.S. Department of Energy, pp. 22–23.

T. C. Paulick, "Textured back-surface reflections for thin-film solar cells," *Journal of Applied Physics*, vol. 62, No. 7, Oct. 1, 1987, pp. 3016–3024.

*Primary Examiner*—Aaron Weisstuch
*Attorney, Agent, or Firm*—Fitzpatrick, Cella, Harper & Scinto

[57] ABSTRACT

A reflective solar cell substrate comprising a base member composed of a metallic material provided with irregularities at the surface thereof and a buffer layer disposed on said base member so as to cover the entire of said irregularities at the surface of said base member, said buffer layer being composed of a substantially transparent or translucent and conductive material, said buffer layer being provided with irregularities at the surface thereof, and said irregularities at the surface of said buffer layer comprising a plurality of thickened convex portions and a plurality of thinned concave portions, said portions being alternately arranged. The reflective solar cell substrate reflects light reaching the substrate without being absorbed by the optically active layer at an effective angle, whereby the solar cell exhibits improved photovoltaic characteristics.

16 Claims, 7 Drawing Sheets

SUBSTRATE HAVING AN UNEVEN SURFACE FOR SOLAR CELL AND A SOLAR CELL PROVIDED WITH SAID SUBSTRATE

BACKGROUND OF THE INVENTION

1. Field of the Invention

The present invention relates to an improved solar cell. More particularly, the present invention relates to a solar cell substrate which makes it possible to scatter incident light and to effectively utilize light absorbed by the active layer of a solar cell, thereby stably improving the power output of the solar cell, and an improved solar cell provided with said substrate.

2. Related Background Art

U.S. Pat. No. 4,126,150 discloses a method of improving the power output of a photovoltaic device provided with a light reflective substrate by making the light reflective surface of said substrate an uneven surface provided with irregularities to increase particularly the optical path length of long wavelength light of absorption coefficient (this is termed a "light confining effect"; the term "irregularity" means an intentionally formed surface shape of a substrate providing certain effects, excluding unintentional shapes such as flaws, etc. at the surface of a substrate). Disclosure similar to that in said U.S. patent is found in Unexamined Japanese Patent publication No. 56(1981)-152276, which also includes a description about roughness of the irregularity. Further, Unexamined Japanese Patent Publication No. 59(1984)-104185 (equivalent to U.S. Pat. No. 4,497,974) discloses optical effects of a substrate having an uneven surface.

Further, in *Journal of Applied Physics*. Vol. 62, No. 7, pp. 3016–3024, mathematical observations on the optical reflection characteristics of the amorphous silicon solar cells in which a textured silver layer is used are described.

As for methods of forming irregularities at the surface of a substrate, a wet etching method by Unexamined Japanese Patent Publication No. 54(1979)-153588 (equivalent to U.S. Pat. No. 4,252,865); a sandblasting method, a facet forming method and a coevaporation method by Unexamined Japanese Patent Publication No. 58(1983)-159383 (equivalent to U.S. Pat. No. 4,419,533); a method of roughening the surface of an aluminum substrate with a D.C. electrolytic etching method or a chemical etching method by Unexamined Japanese Patent Publication No. 59(1984)-14682; a sputter-etching method and a sandblasting method by Unexamined Japanese Patent Publication No. 59(1984)-82778; and a lithography method, a transparent conductor deposition method by means of thermal decomposition spraying, and an ion beam simultaneous deposition method and an etching method by Unexamined Japanese Patent Publication No. 59(1984)-104185 (equivalent to U.S. Pat. No 4,497,974) have been proposed.

Other than the above, with respect to use of a material capable of easily forming irregularities at the surface thereof, an organic insulating layer and a metal reflective layer disposed on said insulating layer by Unexamined Japanese Patent Publication No. 58(1983)-180069; and a ceramic substrate by Unexamined Japanese Patent Publication No. 59(1984)-213174 have been proposed.

In order to prevent a reduction in the yield due to pin holes and the like in the case of forming a Schottky junction or a PIN junction on a reflective substrate, SERI Report San-1286-8 (Carlson et al., Oct. 1978, EY-76-C-03-1286) discloses an advantage of disposing a cermet layer on the reflective substrate.

In addition, in order to prevent occurrence of short circuits due to a flaw or projection on a reflective substrate, Unexamined Japanese Patent Publications Nos. 56(1981)-69875 and 58(1983)-35988 propose intervention of a transparent conductive film.

Further, the above mentioned Unexamined Japanese Patent Publication No. 58(1983)-159383 proposes disposition of a transparent conductive film on the uneven reflective surface of a reflective conductive layer. The transparent conductive film prevents diffusion of the constituent materials of the uneven-shaped reflective conductive layer into the semiconductor layer, which results in deterioration of the characteristics of the semiconductor layer.

Further, the above mentioned Unexamined Japanese Patent Publication No. 59(1984)-104185 (equivalent to U.S. Pat. No. 4,497,974) discloses a technique of improving the light collecting efficiency of a reflective type solar cell in the region of long wavelengths by increasing the optical path by disposing a pair of transparent conductive films, one of which has a roughened surface.

In addition, Unexamined Japanese Patent Publication No. 60(1985)-84888 (equivalent to U.S. Pat. Nos. 4,532,372 and 4,598,306) proposes disposit layer in order to prevent occurrence of short circuits due to pin holes or projections at the upper and lower electrodes.

As described above, there have been a number of proposals in order to improve photovoltaic characteristics of a solar cell. However, various problems still need to be solved in order to provide a desirable solar cell.

For instance, in the case where the light to be incident a solar cell is of substantially short wavelength, such light is effectively absorbed by its optically active layer (that is, the layer which serves to absorb light to generate photocarriers and to transport said photocarriers by way of an internal electric field or by diffusion). There is still not a practical effective solution to efficiently transport the generated photocarriers to the electrode.

Conversely, for the case where the incident light is of long wavelength and is not sufficiently absorbed by the optically active layer, there is still not a practical effective solution to recycle the light which has passed therethrough.

In this regard, there has been a proposal to make the thickness of the optically active layer as thin as possible in the case of a solar cell composed of an amorphous silicon incapable of providing a diffusion length. This proposal is worth discussing in view of improving the photoelectric conversion efficiency by effectively utilizing the long wavelength light.

However, for any of the known amorphous silicon solar cells even when provided with optimized reflective substrates, there are still a number of unsolved problems.

That is, in the case of an amorphous silicon solar cell, for the light of the wavelength to be partly absorbed by the optically active layer, while the remainder passes therethrough and is reflected by the substrate, it is desired that it be reflected at a scattering angle as small as the absorption coefficient is or as large as the wavelength is in order to increase the quantity of light absorbed by the optically active layer.

In the prior art, where it is intended to output a large electric current by increasing the light confining effect, it is common to enlarge the extent of an irregularity at the surface of the substrate. However, enlargement of the irregularity to an excessive extent will cause a short circuit of the solar cell to be produced, resulting in reduction in the yield or poor power output characteristics. problems, it is necessary to use as the reflective substrate a member which satisfies at least the following three items:

(1) reflects light reaching the substrate without being absorbed by the optically active layer at an effective angle, (2) serves to prevent occurrence of short circuits without causing a reduction in the open circuit voltage and the fill factor and also without causing a reduction in the yield due to occurrence of short circuits during the production process thereof, and (3) can be easily prepared at a reduced cost.

The present invention has been accomplished based on the above findings.

An object of the present invention is, therefore, to provide an improved reflective substrate provided with specific irregularities having a large difference of circuits when used as the reflective substrate of a solar cell.

Another object of the present invention is to provide an improved reflective solar cell substrate which reflects light reaching the substrate without being absorbed by the optically active layer at an effective angle to thereby exhibit improved photovoltaic characteristics.

A further object of the present invention is to provide an improved solar cell provided with said reflective substrate which exhibits improved photovoltaic characteristics. concave portions. Thus, this solar cell is not satisfactory in view of preventing occurrence of short circuits throughout the solar cell.

In order to eliminate the above problem relating to occurrence of short circuits due to the irregularities at the surface of the substrate, it is effective to provide a transparent electrode of such a thickness that makes it possible to prevent occurrence of short circuits in the solar cell. As a result of studies by the present inventors, it has been concluded that this idea is effective for the purpose of preventing the occurrence of short circuit but causes other problems. That it, in solar cells having a transparent electrode with such thickness, the electrical resistance of the transparent electrode in the thickness direction increases the series resistance of the solar cell, thereby negatively affecting the characteristics of the solar cell, particularly the open circuit voltage and fill factor. Because of this, the resulting solar cell is poor in photoelectric conversion efficiency.

SUMMARY OF THE INVENTION

The present inventors have made extensive studies in order to solve the foregoing problems in the known solar cells while focusing on the reflective substrate. As a result, it has been found that in order for a solar cell having a thin film semiconductor composed of a material having a large light absorption coefficient, such as an amorphous silicon material, to be free of the foregoing Further, as for the solar cell produced using such substrate, other than the above mentioned problems, there is another in that it is not reliable in practical use.

The present inventors have conducted studies for determining the reasons for short circuits in the case of the foregoing solar cell having a semiconductor layer formed on the roughened surface of a substrate. As a result, it has been recognized that mechanical stress due to vibration or folding and other stress due to a change in the environmental temperature and the like result in accumulation of a type of fatigue at the convex portions of the irregularities of the substrate (which are deemed to latently cause short circuits) to excessively converge electric current thereat, and because of this, short circuits are caused.

As described above, there is a proposal to dispose a buffer layer between the reflective substrate and the semiconductor layer in order to prevent reduction in the yield due to occurrence of short circuits during the production process thereof. The present inventors have found that a technical problem still remained to be solved for this proposal.

That is, the buffer layer in the solar cell of this proposal is formed not only at the convex portions of the roughened surface of the substrate where short circuits are apt to latently occur but on the entire roughened surface of the substrate with a uniform thickness and because of this, the resulting buffer layer is markedly thinner at the convex portions and on the other hand, it is thicker at the A further object of the present invention is to provide an improved solar cell provided with said reflective substrate which provides an improved output current and which excels in power output characteristics.

A still further object of the present invention is to provide an improved solar cell comprising said reflective substrate, a buffer layer and a semiconductor layer, said buffer layer being disposed between said reflective substrate and said semiconductor layer, which excels in photovoltaic characteristics, particularly in the open circuit voltage and fill factor and which exhibits improved power output characteristics.

A still further object of the present invention is to provide an improved solar cell comprising said reflective substrate, a buffer layer and a semiconductor layer, said buffer layer being disposed between said reflective substrate and said semiconductor layer, which is free of the foregoing problem relating to latent occurrence of short circuits which is found in the prior art and which is reliable in practical use.

A still further object of the present invention is to provide an improved solar cell comprising said reflective substrate, a buffer layer having an effective distribution in its thickness and a semiconductor layer, said buffer layer being disposed between said reflective substrate and said semiconductor layer, which is free of increase in the series resistance and which exhibits improved power output characteristics.

The reflective substrate which attains the above objects of the present invention, includes a reflective member having a surface provided with a plurality of irregularities formed of a metal or an allow and a substantially translucent and conductive buffer layer being disposed on the surface of the reflective member such that it covers the entire surfaces of said irregularities, being thickened at each of the convex portions and being thinned at each of the concave portions with a mean ratio of 1.2 or more between the thickness at the convex portions and the thickness at the concave portions, wherein the distance between each pair of the adjacent convex portions of the irregularities at the surface of the reflective member is 0.2 to 2 μm. The buffer layer is composed of a material selected from a material containing magnesium fluoride as the principal component, oxides, nitrides and carbides of indium, tin, cadmium, zinc, antimony, silicon, chromium, silver, copper, aluminum or magnesium.

As for the distance between each pair of the adjacent convex portions of the irregularities at the surface of the reflective member in the present invention, in the case where the convex portions of the irregularities at the surface of the reflective member comprise a plurality of protuberant ridges at the surface of the reflective member, it refers to a mean value of the distances between each pair of the adjacent protuberant ridges. In the case where the convex portions of the irregularities at the surface of the reflective member comprise a plurality of protuberant circular conical, pyramidal or semi-spherical shapes individually ranged at the surface of the reflective member, it refers to a mean value of the distances between each pair of adjacent peaks.

DETAILED DESCRIPTION OF THE PREFERRED EMBODIMENTS

Figure 1:
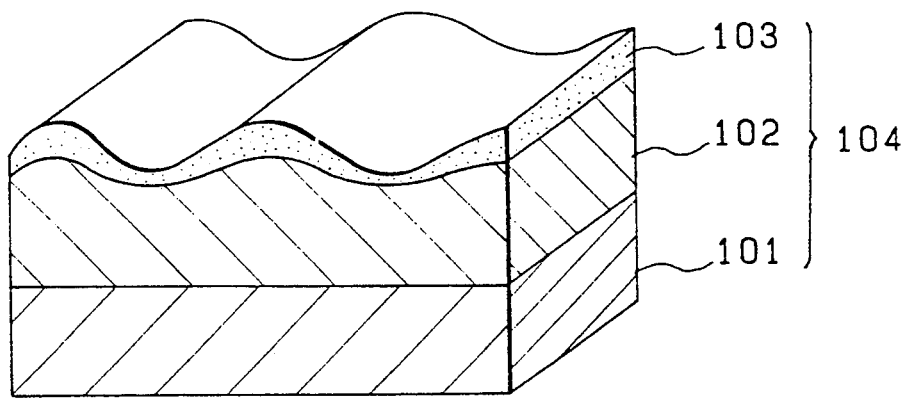
FIG. 1 is a schematic conceptual view of an embodiment of the solar cell substrate according to the present invention.

Shown in FIG. 1 is a schematic conceptual view of an embodiment of the solar cell substrate according to the present invention. In the figure, reference numeral 104 designates a reflective solar cell substrate which comprises a substrate base member 101, a reflective and conductive layer 102 being disposed on the substrate base member, and a buffer layer 103 being disposed on the reflective and conductive layer. As will be described later, it is possible for the reflective and conductive layer 102 to be designed so as to serve also as the substrate base member 101. In this case, the substrate base member 101 can be omitted.

The substrate base member 101 may be of any configuration such as a film-like or plate-like shape. The substrate base member may be constituted by metallic material containing molybdenum, tungsten, titanium, nickel, cobalt, chromium, iron, copper, tantalum, niobium, zirconium, or aluminum as the principal component thereof or an alloy of two or more of these metals; of these, a metallic material containing titanium, nickel, tantalum, niobium or zirconium as the principal component thereof, or an alloy of two or more of these metals, stainless steel and nickel-chromium steel being particularly preferred in view of corrosion resistance. As an alternative, the substrate base member may be a film or sheet made of a synthetic resin such as polyester, polyethylene, polycarbonate, cellulose acetate, polypropylene, polyvinyl chloride, polystyrene, or polyimide. In this case, the substrate base member is deposited with a metallic material or an alloy selected from the above mentioned metallic materials and alloys on the surface thereof. In another alternative, the substrate base member may be a member constituted by glass or ceramic which has been deposited with a metallic material or an alloy selected from the above mentioned metallic materials and alloys on the surface thereof.

The reflective and conductive layer 102 is constituted by an appropriate inorganic material. Specific examples of such inorganic material are silver, aluminum, silicon, and alloys of these materials. Alternatively, alloys containing one or more of iron, copper, nickel, chromium, and molybdenum as the inorganic material can constitute the reflective and conductive layer. Among these inorganic materials, silver, aluminum, and aluminum-silicon alloy are particularly preferred.

As for the reflective and conductive layer 102, it is possible for this layer to also serve as the substrate base member 101 by intentionally thickening the layer to a certain extent. In this case, the substrate base member 101 can be omitted.

The formation of the reflective and conductive layer 102 on the substrate base member 101 may be performed by a resistance heating evaporation method, an electron beam evaporation method, or a sputtering method.

The reflective and conductive layer 102 has a surface provided with irregularities in which the mean distance between each pair of adjacent convex portions is adjusted to 0.2 to 2.0 μm.

The formation of such irregularities at the surface of the reflective and conductive layer may be performed at the time of forming said layer. In this case, it is desirable to use an appropriate apparatus suitable for practicing a resistance heating evaporation method, an electron beam evaporation method, or a sputtering method, which apparatus is provided with a system capable of controlling the temperature of a substrate.

As the method of forming the foregoing irregularities at the surface of the reflective and conductive layer 102, there can be illustrated (i) a method of controlling the crystal grains of a metal or an alloy constituting the reflective and conductive layer to be of a desired average size by appropriately adjusting the temperature of the substrate while forming the reflective and conductive layer, (ii) a scribing method using a laser beam or other energy beam, (iii) a sandblasting method, (iv) a chemical etching method, and (v) a dry etching method. Among these, method (i) is particularly advantageous from an economic view point since formation of the reflective and conductive layer and formation of the irregularities can be performed at the same time. Likewise, method (ii) is also advantageous since formation of the reflective and conductive layer and formation of the irregularities can be performed at the same time by appropriately adjusting the intensity distribution of the laser beam or other energy beam to be used.

In the reflective solar cell substrate according to the present invention, as described above, the buffer layer 103 is disposed on the irregularities formed at the surface of the reflective and conductive layer 102 in such a manner that the thickness is increased at each convex portion and decreased at each concave portion. Thus, sharply developed irregularities are provided at the surface of the buffer layer 103. In a preferred embodiment, the irregularities formed at the surface of the buffer layer are such that the ratio of the mean value $TH_1$ of the thicknesses at the convex portions and the mean value $TH_2$ of the thicknesses at the concave portions satisfies the following equation:

$$TH_1/TH_2 \geq 1.2$$

The buffer layer 103 is desirably formed of a selected material such that it (1) does not chemically react with either the reflective and conductive layer 102 situated thereunder or with an optically active layer (not shown in the figure) to be formed thereon, (2) is capable of adhesion with both the reflective and conductive layer and the optically active layer, and (3) is capable of preventing occurrence of short circuits in the solar cell. Further, the material of which the buffer layer is to be formed, desirably does not increase the series resistance of the solar cell and is of $1 \times 10^{-3}$ to $1 \times 10^3$ Ω·cm in specific resistance.

Further, the buffer layer 103 is desirably transparent or translucent. Particularly, the buffer layer is desirably transparent such that it does not absorb light transmitted through the optically active layer (semiconductor layer) situated thereon.

In view of the above, due consideration should be made to use a material to constitute the buffer layer 103 which Usable materials for the buffer layer include oxides, nitrides, and carbides of at least one element selected from the group consisting of indium, tin, cadmium, zinc, antimony, silicon, chromium, silver, copper, aluminum, and magnesium. Specific preferable examples are ITO (indium-tin oxide), tin oxide, silicon oxide, zinc oxide, aluminum oxide, etc. In any case, as for the material constituting the buffer layer, the composition ratio for the constituent atoms should be determined so that the material satisfies the above requirements. Alternatively, it is possible to use fluorides, such as magnesium fluoride, which satisfy the above requirements to constitute the buffer layer.

As for the surface of the reflective solar cell substrate according to the present invention which is provided with the foregoing irregularities of the buffer layer 103, the mean values as noted above, with respect to the irregularities should be properly determined depending upon the related conditions, particularly, the thickness, the light absorption coefficient and the like. However, in general, it is 50 nm to 1 μm.

The buffer layer 103 with the foregoing thickness distribution disposed on the irregularities formed at the surface of the reflective and conductive layer 102 can be properly formed by (a) a method wherein the surface of the previously formed reflective and conductive layer 102 is subjected to oxidation by irradiating an energy beam in an atmosphere comprising oxygen or the like to thereby form an oxide film, (b) a sputtering method including a planar type DC magnetron sputtering method, an RF type sputtering method and an RF magnetron type sputtering method, (c) a resistance heating evaporation method, (d) an electron beam heating evaporation method, (e) an ion plating method, (f) a reactive ion plating method, (g) a cluster ion beam method, or (h) a CVD method. Among these, methods (a) and (b) are particularly preferable.

In the following, a detailed explanation is made about methods (a) and (b). It should be understood, however, that the buffer layer of the present invention can be formed by a method other than these two methods.

Method (a): a method wherein the surface of the previously formed reflective and conductive layer 102 is subject to oxidation by irradiating an energy beam in an atmosphere comprising oxygen or the like to thereby form an oxide film.

As the energy beam in this method, a laser beam, electron beam, or ion beam can be used.

An explanation will now be given about the case of using a laser beam.

In order to form the buffer layer with the foregoing thickness distribution by this method, an appropriate apparatus provided with a laser beam irradiating system capable of controlling the diameter of laser beam to less than 3 μm, preferably, less than 2 μm, or more preferably, less than 1 μm and also capable of conducting one-dimensional scanning of the optical axis is used.

The wavelength and the intensity of the laser beam should be determined depending upon the configuration of the irregularities to be formed, the radius of the laser beam, the constituent material of the previously formed reflective and conductive layer, and the temperature of the substrate base member. However, in general, as for the wavelength, it is desirably 100 nm to 2 μm, and as for the intensity, it is desirably 0.1 W to 1 kW (continuous oscillation) or 1 mJ to 10 J (pulse).

As for the light source for the laser beam, a YAG laser, excimer laser, chemical laser, dye laser, carbon dioxide laser, or the like can be used. Among these, the YAG laser, excimer laser and carbon dioxide laser are particularly preferred since they can provide a high output power. Especially, the excimer laser using ArF or KrF is the most advantageous in the case where the mean distance between each pair of the adjacent convex portions with respect to the irregularities of the buffer layer to be formed is made to be small since such excimer laser has an oscillation wavelength in ultraviolet region and because of this, the beam diameter can be made small as much as desired.

The use of a carbon dioxide laser of a large output power is advantageous since it serves not only to assist in the formation of the irregularities of the buffer layer, but also to promote the formation thereof.

In order to scan the laser beam during the formation of the buffer layer, there can be employed (i) a method of continuously scanning the laser beam, or (ii) a method of discontinuously scanning the laser beam wherein the scanning of the laser beam is intermittently performed by scanning the laser beam to a predetermined position for a certain period of time, suspending the scanning of the laser beam for a certain period of time, and resuming the scanning the laser beam to another predetermined position. Methods (i) and (ii) are selectively employed depending upon the configuration of the irregularities of the buffer layer to be formed.

That is, method (i) is employed in the case of forming the irregularities of the buffer layer in a spiral form, and method (ii) is employed in the case of forming the irregularities of the buffer layer in a concentric form.

Particularly, method (ii) makes it possible to provide desirably minute irregularities at the surface of the buffer layer because the pulse beam to be repeatedly applied to the same position.

In order to form the buffer layer with the foregoing thickness distribution by method (a), the substrate base member is rotated during the formation of the buffer layer. In this respect, the foregoing apparatus suitable for practicing method (a), is desirably provided with a table for supporting the substrate base member which can be rotated at a desired angular speed of, preferably, more than 1000 rpm, or more preferably, more than 2000 rpm in terms of maximum number of revolutions.

Further, in order to form the buffer layer in accordance with method (a), it is advantageous to additionally heat the substrate base member by an appropriate heating means such as an infrared heater or projector lamp of, preferably, more than 100 W or more preferably, more than 300 W in output power at the time of forming the buffer layer while irradiating the laser beam.

In order to form the buffer layer in accordance with method (a), the portion for the previously formed reflective and conductive layer to be a convex portion of the irregularities of the buffer layer, is densely oxidized and the portion of the previously formed reflective and conductive layer to be a concave portion of the irregularities of the buffer layer, is thinly oxidized, for example, by such a manner that will be described below. It illustrative purposes only and is not intended to restrict the present invention.

That is, as the laser beam irradiated at the time of forming the irregularities of the buffer layer, two separate laser beams are used. The formation of the buffer layer having the irregularities with the foregoing thickness distribution at the surface thereof is performed by irradiating these two laser beams separately in an oxygen-containing atmosphere while adjusting the intensity distribution of each laser beam so as to heat the convex portion of the previously formed reflective and conductive layer situated between the two laser beams at a relatively high temperature whereby they densely oxidize said portion to form a convex portion of the irregularities, whereas a channel forming a concave portion of the irregularities is formed at the remaining portion of said reflective an conductive layer which is heated at a relatively low temperature. As a result of subjecting the previously formed reflective and conductive layer provided with irregularities at the surface thereof to oxidation in this way, an oxide layer is formed as the buffer layer which is provided with irregularities comprising a plurality of thicker convex portions and a plurality of thinner concave portions alternately ranged on the uneven surface of the reflective and conductive layer.

Figure 3:
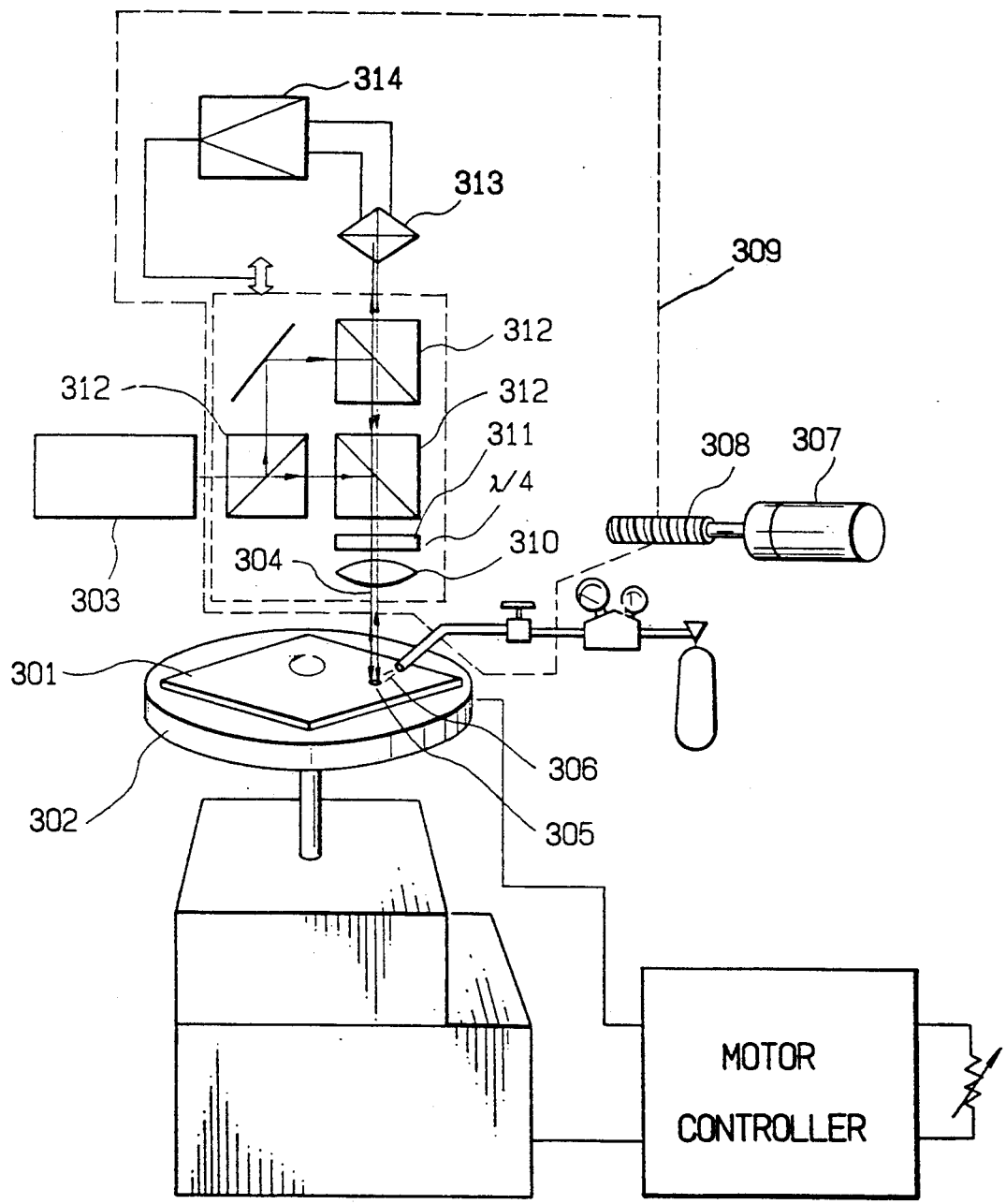
FIG. 3 is a schematic explanatory view of the constitution of an apparatus provided with a laser beam irradiation means which is suitable for forming the uneven structure at the surface of a substrate member and the buffer layer in the preparation of the solar cell substrate according to the present invention.

Shown in FIG. 3 is an apparatus suitable for practicing the above method.

In the figure, reference numeral 301 indicates a substrate base member having the foregoing reflective and conductive layer thereon which is placed on the surface of a rotary table 302 capable of regulating its angular speed The substrate base member 301 is rotated at a desired frequency of revolution.

The laser beam is outputted from the laser beam irradiating device 303 and is treated by an optical system containing three beam splitters 312 to provide double laser beams 304 as shown in the figure, wherein the two laser beams are provided separately while keeping a spacing of 0.1 to 10 μm between them. These two laser beams are irradiated to a predetermined position 305 of the surface of the reflective and conductive layer disposed on the substrate base member 301, while one-dimensionally scanning the position 305 to be irradiated in the direction from the center toward to periphery of the substrate base member 301 or in the direction from the periphery to the center of said substrate base member. In this case, irradiation of the laser beams is performed while controlling the rotation of the substrate base member such that the rotation speed in the tangential direction at the position to be irradiated is maintained substantially constant. At this time, oxygen gas 306 is supplied near the position to be irradiated with the laser beams at a flow rate of, preferably, 1 sccm to 10 slm or more preferably, 10 sccm to 1 slm.

Further, in order to improve the thickness distribution of the irregularities formed at the surface of the buffer layer, it is possible to subject only the convex portions of said irregularities to further oxidation with irradiation of an energy beam such as a laser beam in an oxygen-containing atmosphere while tracking said convex portions by a conventional tracking method.

For such a tracking method, either a mechanical tracking method or an optical tracking method may be employed. These two methods will now be described with reference to FIG. 3. In the mechanical tracking method, a system 309 for controlling a laser irradiation is precisely moved in the direction as required through a worm gear pair 308 by the action of a pulse motor 307 based on a previously inputted information signal with respect to the position of the previously formed convex portion. In the optical tracking method the system 309 for laser irradiation is moved in the direction as required based on an optical signal for focusing obtained by detecting by a quarterly dividing sensor 313 light which is transmitted from the convex portion as formed through an objective 310, a polarizing lens 311 and two beam splitters 312 to obtain a detected signal and amplifying the detected signal by an amplifier 314.

Method (b): sputtering method

Formation of the buffer layer having the irregularities with the foregoing thickness distribution at the surface thereof, may be performed by any of the planar type DC magnetron sputtering method, the RF type sputtering method, and the RF magnetron type sputtering method. However, among these three sputtering methods, the planar type DC magnetron sputtering method is the most advantageous in view of being capable of realizing high speed sputtering by a small scale apparatus.

In accordance with this method, it is a matter of course that the buffer layer having the irregularities with the foregoing thickness distribution at the surface thereof can be properly formed. It is also possible to form the foregoing reflective and conductive layer on a substrate base member and successively form the above buffer layer on the previously formed reflective and conductive layer.

Figure 4:
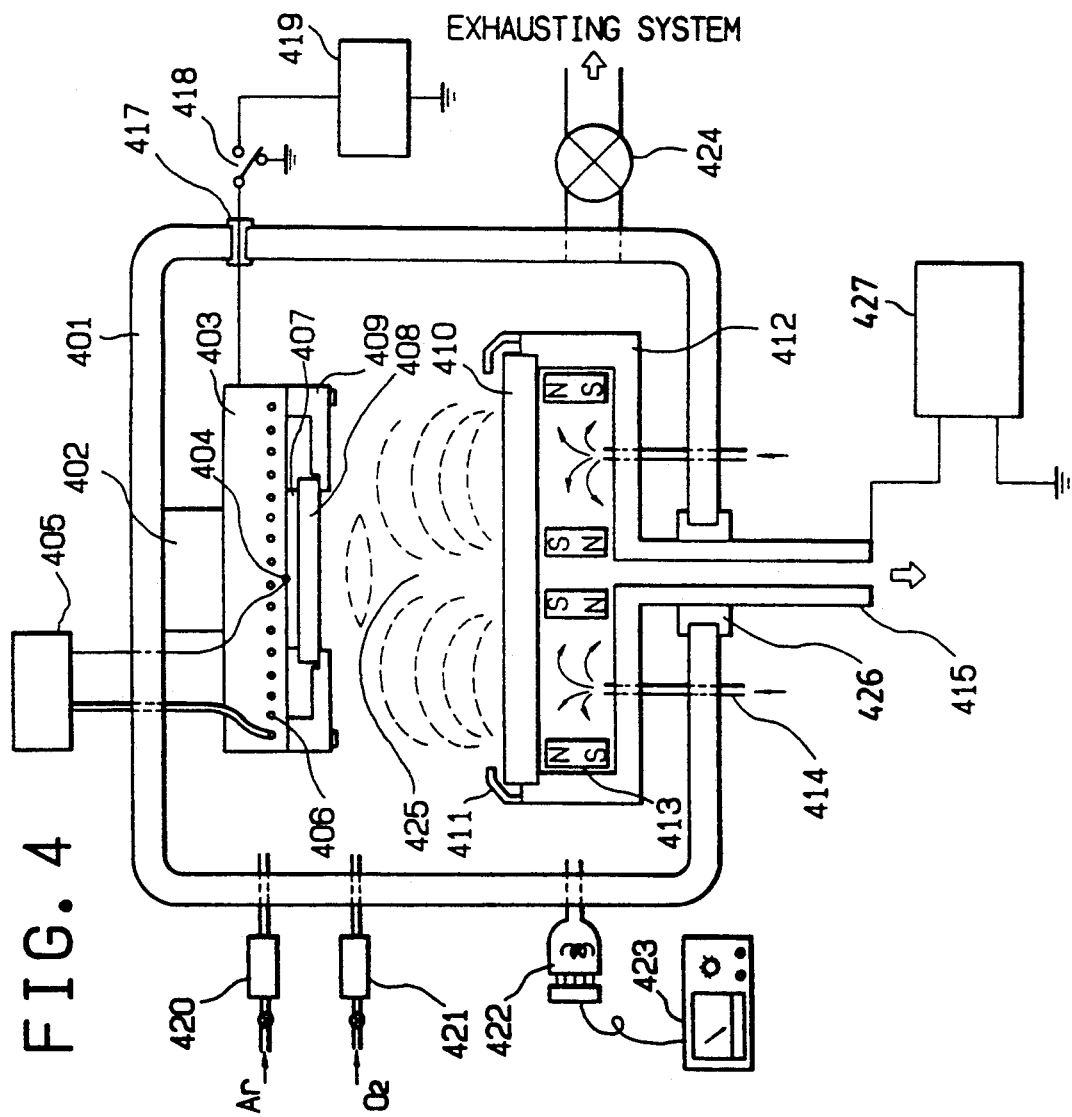
FIG. 4 is a schematic explanatory view of the constitution of a planar type DC magnetron sputtering apparatus which is suitable for preparing the solar cell substrate according to the present invention.

Shown in FIG. 4, is a schematic conceptual view of the constitution of an apparatus suitable for practicing the planar type DC magnetron sputtering method.

In the figure, reference numeral 401 indicates a substantially enclosed vacuum vessel containing a heating plate 403 which is supported by an insulated driving system 402 capable of adjustment of its angle. Reference numeral 407 indicates a homogeneous thermal conductor fixed to the heating plate 403. Reference numeral 408 indicates a substrate base member positioned on the surface of the thermal conductor 407 while being held by means of a holding device 409. The thermal conductor 407 is made of a metal or alloy capable of efficiently transmitting heat from the heating plate 403 to the substrate base member 40 such as aluminum, gold, silver, copper, or stainless steel. The thermal conductor 407 is desirably 0.01 to 1 mm in thickness. Reference numeral 419 indicates a bias power source (DC power source) which is connected, through a lead wire (provided with a change-over switch 418) to the heating plate 403. By means of switch 418, the substrate base 408 can be maintained at a ground potential or at a predetermined reference potential by way of the bias power source 419. Reference numeral 417 indicates an insulator.

The driving system 402 is designed so as to optionally change the angle of the substrate base member 408 about the center thereof by a driving means (not shown) provided outside the vacuum vessel 401. The heating plate 403 contains heater 406 and thermo couple 404 installed therein. Reference numeral 405 indicates a temperature controller capable of adjusting or maintaining the temperature of the heating plate 403.

The temperature of the substrate base member 408 during formation of the layer provided with desired irregularities by this method, should be properly determined depending upon the related conditions. However, in general, the substrate base member is maintained at a temperature of 200° to 500° C. in the case of forming the buffer layer or in the case of successively forming the reflective and conductive layer and the buffer layer.

Reference numeral 410 indicates a target situated opposite the substrate base member 408. The target 410 is positioned on the surface of a target support base 412. Reference numeral 411 indicates a means for preventing the target 410 from being removed from the target support base 412. Reference numeral 425 indicates a plasma generation space situated between the substrate base member 408 and the target 410.

The target support base 412 contains a plurality of magnets 413 installed therein. The magnets 413 form a magnetic field in the plasma generation space 425.

The target support base 412 also contains a plurality of cooling systems capable of cooling the target 410 in order to prevent it from being over-heated during the sputtering process. Reference numeral 414 indicates a pipe for supplying a cooling medium such as water into one of the cooling systems. Reference numeral 415 indicates a discharge pipe for discharging the cooling medium used in the cooling systems. The discharge pipe 415 is electrically isolated from the circumferential wall of the vacuum vessel 401 through an insulator 426.

The target support base 412 is connected through a lead wire to a DC power source 427. To the target 410, a predetermined DC voltage from the DC power source 427 is applied through the target support base 412. The DC current to be outputted from the DC power source 427 upon sputtering the target is preferably set at 0.01 to 1 A, or more preferably at 0.1 to 0.5 A. Reference numeral 420 indicates a mass flow controller connected to a sputtering gas (Ar) supply pipe which opens into the vacuum vessel 401. Reference numeral 421 indicates a mass flow controller connected to an oxygen gas ($O_2$) supply pipe which opens into the vacuum vessel 401. The sputtering gas (Ar) supplied to the vacuum vessel 401 during the sputtering process, is desirably adjusted to a flow rate of 1 sccm to 1 slm. Likewise, the oxygen gas ($O_2$) supplied to the vacuum vessel 401 during the sputtering process, is desirably adjusted to a flow rate of 1 sccm to 1 slm.

Reference numeral 422 indicates a vacuum gage for monitoring the inner pressure of the vacuum vessel 401. Reference numeral 423 indicates a display electrically connected to the vacuum gage.

The vacuum vessel 401 is provided with an exhaust pipe connected through a main valve 424 to a vacuum pump (not shown). The inside of the vacuum vessel 401 can be brought to and maintained at a predetermined vacuum degree by operating the vacuum pump to evacuate the inside of the vacuum vessel 401 through the exhaust pipe while regulating the opening of the main valve 424.

Prior to commencing the sputtering process, the vacuum vessel 401 is desirably evacuated to a vacuum degree of, preferably, less than $1 \times 10^{-4}$ Torr, or more preferably, less than $1 \times 10^{-5}$ Torr. During the sputtering process, it is desirable that the inner pressure of the vacuum vessel 401 be maintained at a vacuum degree of between 1 mTorr and 1 Torr.

The reflective substrate of the present invention is characterized by having the foregoing buffer layer provided with such specific irregularities as mentioned above at the surface thereof having a large difference of elevation which hardly cause short circuits in a solar cell provided with the reflective substrate.

The present invention includes an improved solar cell having the above reflective substrate which reflects light reaching the substrate without being absorbed by the optically active layer at an effective angle thereby to exhibit improved photovoltaic characteristics and which excels particularly in open circuit voltage and fill factor. Further, the solar cell according to the present invention provides an improved output current value and excels in power output characteristics.

In the following, a description is given about an embodiment of the solar cell in which the reflective substrate of the present invention is used.

Figure 2:
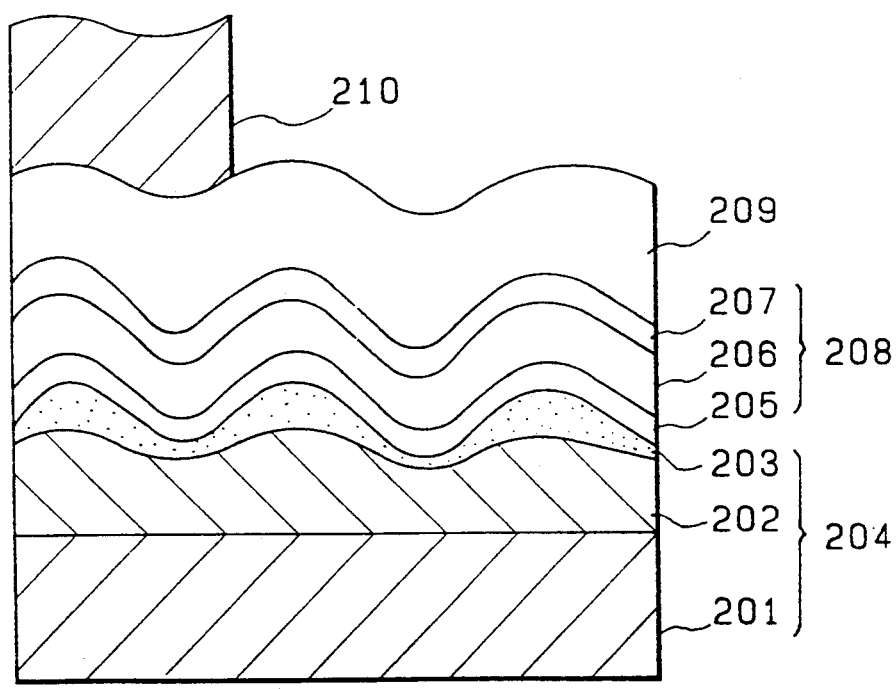
FIG. 2 is a schematic conceptual view of an example of the constitution of the solar cell according to the present invention in which the solar cell substrate according to the present invention is used.

Shown in FIG. 2 is a schematic view of the constitution of a PIN junction type solar cell having the reflective substrate of the present invention.

The solar cell shown in FIG. 2, comprises a PIN junction solar cell element 208 (comprising an n-type semiconductor layer 205, an i-type semiconductor layer 206 and a p-type semiconductor layer 207), a transparent electrode 209 and a collecting electrode 210 being disposed in this order on the reflective substrate 204 (comprising a substrate base member 201, the reflective and conductive layer provided with irregularities at the surface thereof 202 being disposed on said substrate and the buffer layer provided with irregularities at the surface thereof being disposed on said reflective and conductive layer).

In this solar cell, light impinged through the transparent electrode 209 into the solar cell element 208 is partially absorbed by its i-type semiconductor layer 206 to generate photocarriers capable of contributing to power generation, but part of the light (that is, long wavelength light which is small in absorption coefficient) reaches the reflective substrate 204. However, such long wavelength light reaching the reflective substrate 204 is efficiently reflected at the specific irregularities provided at the surface thereof to re-enter the solar cell element 208 wherein it generates additional photocarriers capable of contributing to power generation.

In consequence of this, the PIN junction type solar cell according to the present invention enables efficient adsorption of almost all of the light incident thereon for generating photocarriers capable of contributing to power generation without loss of light from the device which is not utilized, such as is found in the case of the known solar cell having a conventional reflective substrate. Thus, the PIN junction type solar cell according to the present invention exhibits improved photovoltaic characteristics.

Figure 5:
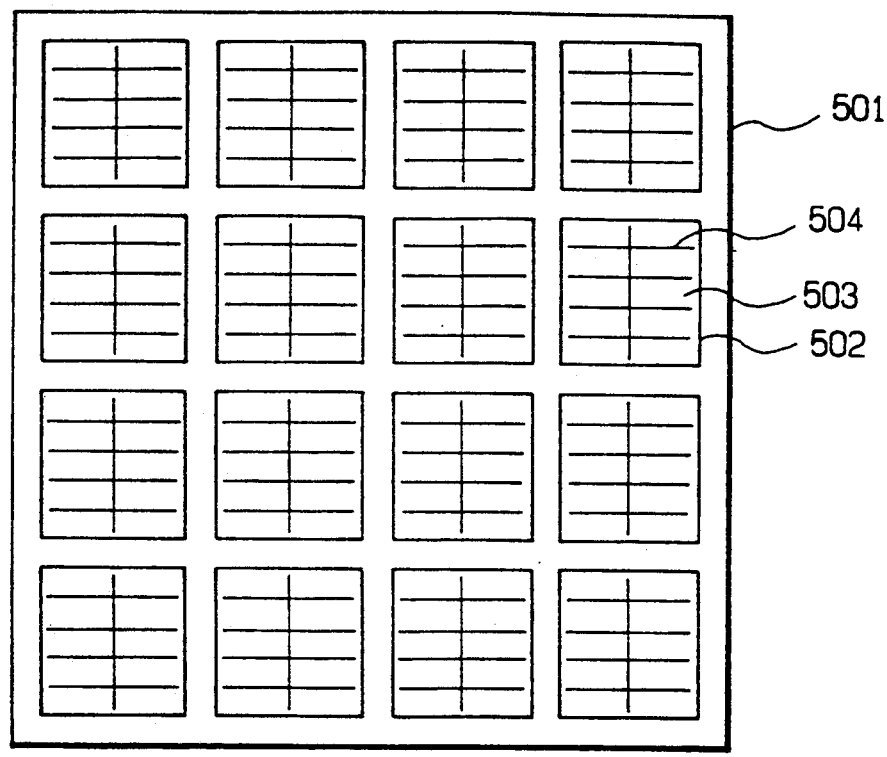
FIG. 5 is a schematic explanatory view of the constitution of a solar cell module comprising an integrated plurality of solar cell units in which the solar cell substrate according to the present invention is used.

Shown in FIG. 5, is a schematic explanatory view of an embodiment of a solar cell module according to the present invention which comprises a plurality of solar cell units disposed on a substrate 501 comprising the foregoing reflective substrate of the present invention. Each of the solar cell units comprises a solar cell element 502 comprising the foregoing PIN junction solar cell element 208, a transparent electrode 503 and a collecting electrode 504 being disposed in this order on the substrate 501. In this embodiment, the light receiving area of each of the solar cell units is 1 cm$^2$.

In any case, for the optically active layer, i.e., the solar cell element comprising a plurality of semiconductor layers, each constituent semiconductor layer is composed of a non-single crystal silicon material such as polycrystalline silicon material, microcrystalline silicon material, amorphous silicon material, etc., a non-single crystalline silicon germanium material, a non-single crystal silicon carbide material, CdS, or CdSe. Alternatively, each constituent semiconductor layer may be comprised of any of the ZnSe system films disclosed in U.S. Pat. No. 4,851,302.

Thus, the present invention provides solar cell modules comprising a plurality of PIN junction solar cell elements disposed on the reflective substrate of the present invention.

In the following, experiments which were conducted in order to complete the present invention will be described.

Experiment 1

As the substrate base member 101, a stainless steel plate of SUS 304 (trade name) which is of 50 mm×50 mm in size and 0.5 mm in thickness and having a mirror finished surface was provided.

Using the planar type DC magnetron sputtering apparatus shown in FIG. 4, on the mirror finished surface of the substrate base member 101 the reflective and conductive layer 102 was formed in the following manner.

A target comprising Ag of 99.99% purity was used. This target was subjected to sputtering while maintaining the substrate base member at 300° C. and feeding a sputtering gas comprising Ar gas at a flow rate of 25 sccm under the conditions of 5 mTorr for the sputtering pressure and 0.15 A for the sputtering electric current, to thereby form an about 1 μm thick Ag film to form the reflective and conductive layer 102. In this case, the substrate base member 408 was positioned directly opposite the target, and the driving system 402 was not operated.

The surface of the reflective and conductive layer 102 thus formed on the mirror finished surface of the substrate base member 101 was observed by an electron microscope. As a result, it was found that the reflective and conductive layer (Ag film) is substantially uniform all over the mirror finished surface of the substrate base member, the distance between the bottom of the concave portions and the summit of the convex portions is 0.6 to 0.7 μm, and the mean distance between the adjacent convex portions is about 1.0 μm.

Then, using the same planar type DC magnetron sputtering apparatus as used in the formation of the reflective and conductive layer 102, the foregoing buffer layer 103 was formed in the following manner.

That is, a target comprising zinc oxide of 99.99% purity was used. This target was subjected to sputtering while maintaining the substrate base member at 300° C. and feeding Ar gas and O$_2$ gas as the sputtering gas at respective flow rates of 25 sccm and 0.1 sccm, under the conditions of 5 mTorr for the sputtering pressure, 0.8 A for the sputtering electric current and 170 Å/min. for the deposition rate, to thereby form an about 1 μm thick film comprising zinc oxide to form the buffer layer 103. The film formation in this case was performed while intermittently moving the heating plate 403 at a 20 second periodic cycle such that the normal line at the center of the substrate member 408 establishes an apparent circular cone-like side face, by operating the driving system 402 supporting the heating plate 403 having the substrate member 408 thereon.

Following the above procedures, eight substrate specimens (substrates (a) to (h)) were prepared by changing the apex angle of the apparent circular cone-like side face established by the normal line at the center of substrate member 408 by operating the driving system 402 to a value in the range of 0° (the state when the driving system 402 is not operated) to 30° as shown in Table 1.

For each of the resultant substrate specimens (a) to (h), the surface of the buffer layer 103 was observed by an electron microscope. As a result, it was found that the buffer layer 103 is substantially uniform all over the surface of the reflective and conductive layer 102, the distance between the bottom of the concave portions and the summit of the convex portions is 0.6 to 0.7 μm, and the mean distance between the adjacent convex portions is about 1.0 μm in each case.

Then, for each of the substrate specimens (a) to (h), the cross section of the buffer layer 103 was observed by an electron microscope. As a result, it was found that the mean ratio between the thickness of the convex portion and the thickness of the concave portion of the buffer layer differs depending upon the value for the apex angle of the apparent circular cone-like side face established by the normal line at the center of the substrate member 408 by operating the driving system 402, and it varies in the range of from 1 to 2 as shown in Table 1.

Using each of the eight substrate specimens, a solar cell module of the configuration shown in FIG. 5 was prepared, having sixteen amorphous silicon solar cell units respectively of the constitution shown in FIG. 2 and of 1 cm$^3$ in area arranged as shown in FIG. 5. Thus, eight solar cell modules were obtained.

For each of the resultant solar cell modules, the photoelectric conversion efficiency was observed by using a commercially available solar cell simulator (AM 1.5, 100 mW/cm$^2$; produced by Yamashita Densoh Kabushiki Kaisha).

Figure 6:
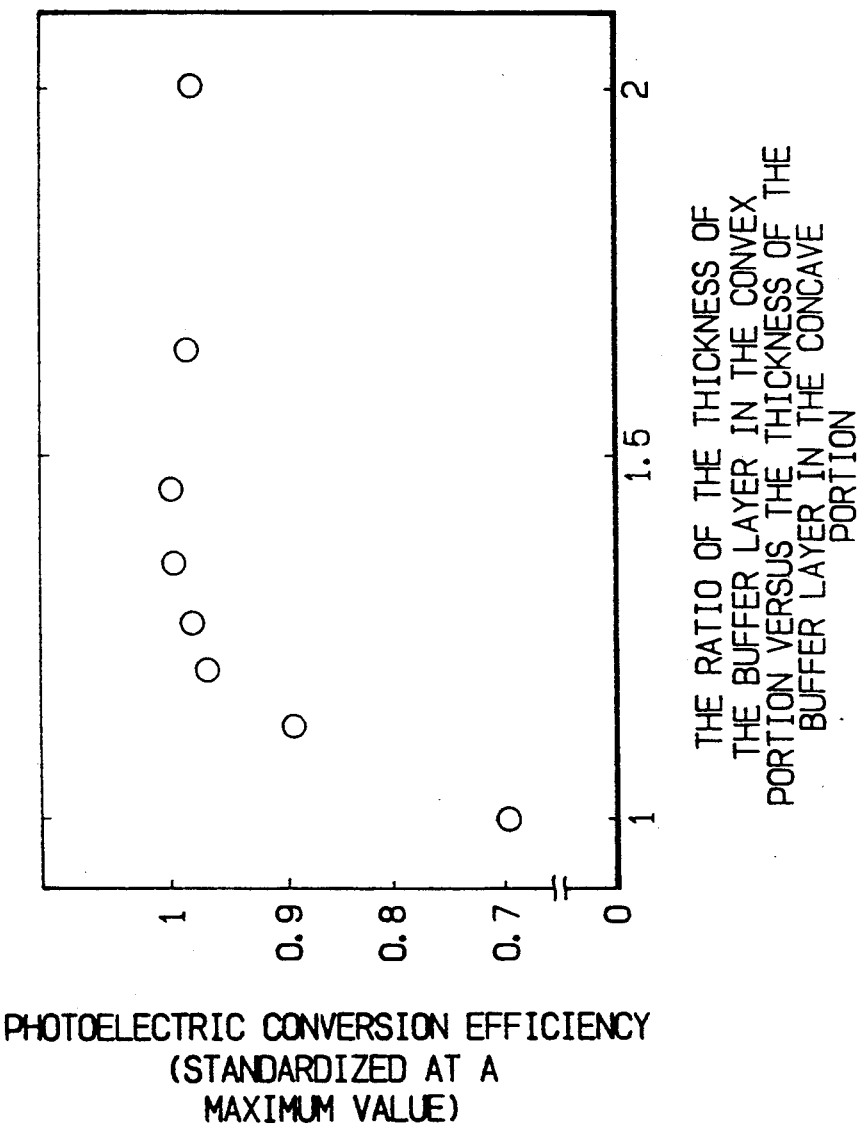
FIG. 6 is a graph in which the standardized photoelectric conversion efficiencies of the solar cells obtained in Experiment 1 are collectively shown.

The results obtained were as shown in FIG. 6.

From the results shown in FIG. 6., it was recognized that there is a marked improvement in the power output characteristics of the solar cells when the mean ratio between the thickness of the convex portions and the thickness of the concave portions of the irregularities of the buffer layer is 1.2 or more.

Experiment 2

As the substrate base member 101, a stainless steel plate of SUS 304 (trade name) which is of 50 mm×50 mm in size and 0.5 mm in thickness and having a mirror finished surface was provided.

Using the planar type DC magnetron sputtering apparatus shown in FIG. 4, on the mirror finished surface of the substrate base member 101 was formed the foregoing reflective and conductive layer 102 in the following manner.

That is, a target comprising Ag of 99.99% purity was used. This target was subjected to sputtering while maintaining the substrate base member at 200° C. and feeding a sputtering gas comprising Ar gas at a flow rate of 25 sccm under the conditions of 5 mTorr for the sputtering pressure and 0.15 A for the sputtering electric current, to thereby form an about 1 $\mu$m thick Ag film on the mirror finished surface of the substrate base member. In this case, the substrate base member 408 was positioned directly opposite the target and the driving system was not operated.

The surface of the layer thus formed was observed by an electron microscope. As a result, it was found that the surface of the layer (Ag film) is a mirror surface.

The layer comprising the foregoing about 1 $\mu$m thick Ag film formed on the stainless steel as the substrate base member was treated in the following manner to form spirally structured irregularities at the surface thereof, thus forming the reflective and conductive layer 102.

That is, the above substrate base member having the layer comprising the foregoing about 1 $\mu$m thick Ag film was placed on the rotary table in the apparatus shown in FIG. 3, wherein said spirally structured irregularities were formed at the surface of said layer to thereby form the reflective and conductive layer 102, which was followed by subjecting to oxidation with irradiation of laser beams in an oxygen containing atmosphere to thereby form the buffer layer having irregularities with the foregoing thickness distribution. That is, at the first stage, the rotary table 302 was rotated at a rotating speed of about 3000 rpm, wherein the laser beam from the laser beam irradiating device 303 comprising a commercially available excimer laser beam irradiating device using KrF gas (oscillation wavelength: 249 nm, average power output: 5 W) was optically treated by the optical system to provide double beams of about 1.3 $\mu$m in beam diameter and about 1.0 $\mu$m in interval, which were scanned 70 mm. Oxygen gas was supplied near the point where the laser beams were irradiated at a flow rate of 200 sccm.

Following the above procedures, thirteen substrate specimens (substrates (i) to (u)) were prepared by changing the scanning speed of the laser beams in the range of from 5 $\mu$m/sec to 200 $\mu$m/sec as shown in Table 2.

For each of the resultant substrate specimens (i) to (u), the surface of the buffer layer 103 was observed by an electron microscope. As a result, it was found that the buffer layer 103 is substantially uniform all over the surface of the reflective and conductive layer 102 and the distance between the bottom of the concave portions and the summit of the convex portions is 0.6 to 0.7 $\mu$m. It was also found that the mean distance between the adjacent convex portions of the irregularities formed at the surface of the buffer layer is varied from 0.1 $\mu$m to 4 $\mu$m depending upon the scanning speed of the laser beams as shown in Table 2.

Then, for each of the substrate specimens (i) to (u), the cross section of the buffer layer 103 was observed by an electron microscope. As a result, it was found that the mean ratio between the thickness of the convex portions and the thickness of the concave portions of the buffer layer is 1.8 in any case.

For each of the thirteen substrate specimens, a solar cell module of the configuration shown in FIG. 5 was prepared, having sixteen amorphous silicon solar cell units each of the constitution shown in FIG. 2 and of 1 cm$^2$ in area arranged in the way as shown in FIG. 5. Thus, thirteen solar cell modules were obtained.

For each of the resultant solar cell modules, the photoelectric conversion efficiency was observed by using a commercially available solar cell simulator (AM 1.5, 100 mW/cm$^2$; produced by Yamashita Densoh Kabushiki Kaisha).

Figure 7:
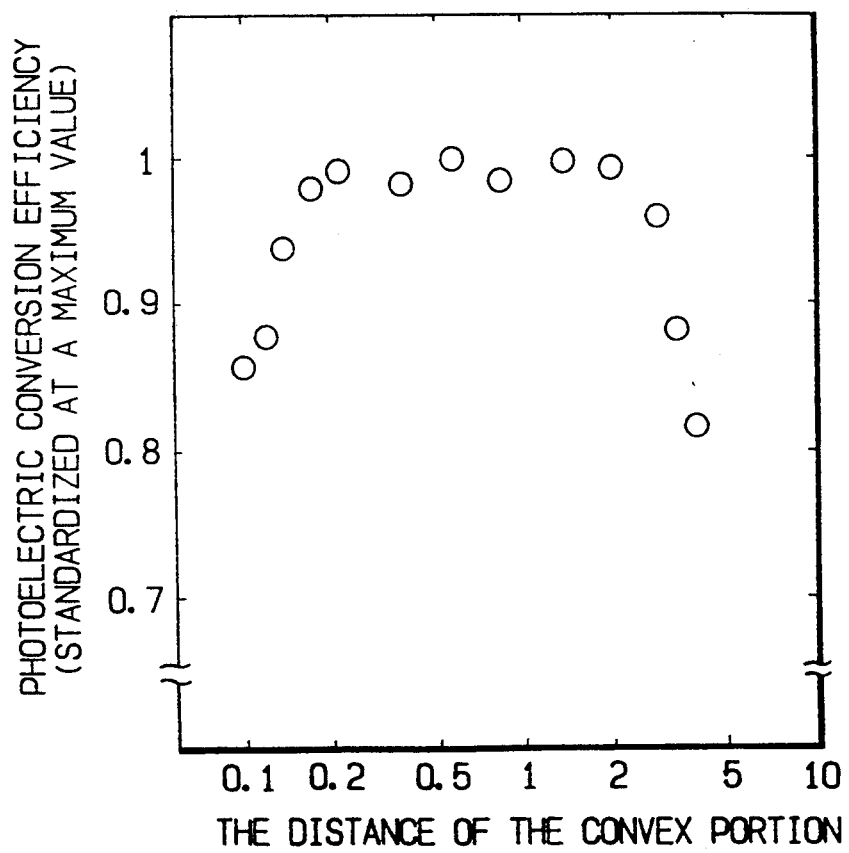
FIG. 7 is a graph in which the standardized photoelectric conversion efficiencies of the solar cells obtained in Experiment 2 are collectively shown.

The results obtained were as shown in FIG. 7.

From the results shown in FIG. 7, it was recognized that there is a marked improvement in the power output characteristics of the solar cells when substrates of 0.2 $\mu$m to 2.0 $\mu$m mean distance between the adjacent convex portions of the irregularities of the buffer layer are used.

As described above, the present invention has been accomplished based on the findings obtained in the above experiments.

The present invention will now be described more specifically while referring to the examples, but the present invention is not intended to be restricted in scope only to these examples.

EXAMPLE 1

In this example, the procedures of Experiment 2 were repeated, except that the scanning speed of the laser beams was changed to 50 $\mu$m/sec, to thereby obtain a reflective solar cell substrate according to the present invention of 1 $\mu$m mean distance between the adjacent convex portions with respect to the irregularities of the buffer layer.

Using the reflective solar cell substrate thus obtained, a solar cell module of the configuration shown in FIG. 5 was prepared, having sixteen amorphous silicon solar cell units respectively of the constitution shown in FIG. 2 and of 1 cm$^2$ in area arranged as shown in FIG. 5.

For comparison purposes, the procedures of Experiment 2 were repeated, except that Ar gas was used instead of oxygen gas, to thereby obtain a comparative reflective solar cell substrate.

Using this comparative reflective solar cell substrate, a comparative solar cell module of the same kind as described above was prepared.

For each of the resultant two solar cell modules, the photoelectric conversion efficiency was measured in the same manner as in Experiment 1. Further, the open circuit voltage and short circuit current were measured in accordance with a conventional method.

As a result, it was found that the solar cell module of the present invention surpasses the comparative solar cell module by a factor of 1.14 with respect to the open circuit voltage, a factor of 1.12 with respect to the short circuit current, and a factor of 1.33 with respect to the photoelectric conversion efficiency.

EXAMPLE 2

As the substrate base member 101, an aluminum plate which is of 50 mm×50 mm in size and 0.5 mm in thickness and having a mirror finished surface was used (this aluminum plate also serves as the reflective and conductive layer).

The above aluminum plate was placed on the rotary table 302 in the apparatus shown in FIG. 3, wherein the buffer layer having spirally structured irregularities similar to those in Experiment 2 at the surface thereof was formed on the aluminum plate in the following manner. That is, the procedures of Experiment 2 were repeated, except for the following. An Ar gas laser (oscillation wavelength: about 500 nm, average power output: 10 W) was used as the laser beam source. The laser beam from the laser beam source was optically treated by the optical system to provide six parallel beams of 10 $\mu$m in interval and 1.2 $\mu$m in beam diameter, which were scanned 10 mm at a scanning speed of 1 $\mu$m during one rotation cycle of the rotary table. A filter capable of varying the permeability was used in order that each of the beams could be independently controlled with respect to its intensity. Thus, a reflective solar cell substrate according to the present invention was obtained having a buffer layer 103 provided with the foregoing specific irregularities at the surface thereof on the aluminum plate.

The surface of the resultant substrate was observed by an electron microscope. As a result, it was found that the buffer layer is substantially uniform all over the surface of the aluminum plate, the mean distance between the adjacent convex portions of the irregularities formed is 1.5 $\mu$m, and the distance between the bottom of the concave portion and the summit of the convex portion is 0.5 to 0.8 $\mu$m. The cross section of the buffer layer 103 was observed by an electron microscope. As a result, it was found that the mean ratio between the thickness of the convex portion and the thickness of the concave portion of the irregularities is 2.2.

Using the reflective solar cell substrate thus obtained, a solar cell module of the configuration shown in FIG. 5 was prepared, having sixteen amorphous silicon solar cell units respectively of the constitution shown in FIG. 2 and of 1 cm² in area arranged as shown in FIG. 5.

For comparison purposes, the above procedures were repeated, except that Ar gas was used instead of the oxygen gas, to thereby obtain a comparative reflective solar cell substrate.

Using this comparative reflective solar cell substrate, a comparative solar cell module of the same kind as described above was prepared.

For each of the resultant two solar cell modules, the photoelectric conversion efficiency was measured in the same manner as in Experiment 1. Further, the open circuit voltage and short circuit current were measured in accordance with a conventional method.

As a result, it was found that the solar cell module of the present invention surpasses the comparative solar cell module by a factor of 1.2 with respect to the open circuit voltage, a factor of 1.05 with respect to the short circuit current, and a factor of 1.23 with respect to the photoelectric conversion efficiency.

EXAMPLE 3

As the substrate base member 101, a synthetic resin film made of polyethyleneterephthalate of 50 mm×50 mm in area size and 0.76 mm in thickness was used.

On the surface of the synthetic resin film, an about 2 $\mu$m thick aluminum layer was evaporated by an argon sputtering method under the conditions capable of providing a mirror finished surface thereon.

This substrate member was placed on the rotary table 303 capable of controlling the angular speed of the apparatus shown in FIG. 3. While rotating the rotary table at a rotation speed of about 2000 rpm, laser beams 304 from an excimer laser beam irradiating device 303 using ArF gas (oscillation wavelength: 193 nm, average power output: 5 W) was scanned 70 mm one-dimensionally while supplying oxygen gas and moving the irradiation position 305 in the direction from the center of the substrate member toward the periphery.

Thus, a reflective solar cell substrate according to the present invention was obtained having a buffer layer 103 provided with the foregoing specific irregularities at the surface thereof on the aluminum layer.

The surface of the resultant substrate was observed by an electron microscope. As a result, it was found that the buffer layer is substantially uniform all over the surface of the aluminum layer, the mean distance between the adjacent convex portions of the irregularities formed is 0.5 $\mu$m, and the distance between the bottom of the concave portion and the summit of the convex portion is 0.1 to 02. $\mu$m. The cross section of the buffer layer 103 was observed by an electron microscope. As a result, it was found that the mean ratio between the thickness of the convex portion and the thickness of the concave portion of the irregularities is 1.2.

Using the reflective solar cell substrate thus obtained, a solar cell module of the configuration shown in FIG. 5 was prepared, having sixteen amorphous silicon solar cell units respectively of the constitution shown in FIG. 2 and of 1 cm² in area arranged as shown in FIG. 5.

For comparison purposes, the above procedures were repeated, except that Ar gas was used instead of the oxygen gas, to thereby obtain a comparative reflective solar cell substrate.

Using this comparative reflective solar cell substrate, a comparative solar cell module of the same kind as described above was prepared.

For each of the resultant two solar cell modules, the photoelectric conversion efficiency was measured in the same manner as in Experiment 1. Further, the open circuit voltage and short circuit current were measured in accordance with a conventional method.

As a result, it was found that the solar cell module of the present invention surpasses the comparative solar cell module by a factor of 1.05 with respect to the open circuit voltage, a factor of 1.22 with respect to the short circuit current, and a factor of 1.27 with respect to the photoelectric conversion efficiency.

EXAMPLE 4

As the substrate base member 101, a stainless steel plate of SUS 304 (trade name) which is of 50 mm×50 mm in area size and 0.5 mm in thickness and having a mirror finished surface was provided.

Using the planar type DC magnetron sputtering apparatus shown in FIG. 4, on the mirror finished surface of the substrate base member 101 the reflective and conductive layer 102 was formed in the following manner.

That is, as the target, a target comprising Ag of 99.99% purity was used. This target was subjected to sputtering while maintaining the substrate base member at 300° C. and feeding a sputtering gas comprising Ar gas at a flow rate of 25 sccm under the conditions of 5 mTorr for the sputtering pressure and 0.15 A for the sputtering electric current, to thereby form an about 1 μm thick Ag film as the reflective and conductive layer 102. In this case, the substrate base member 408 was positioned directly opposite the target, and the driving system 402 was not operated.

The surface of the reflective and conductive layer 102 thus formed on the mirror finished surface of the substrate base member 101 was observed by an electron microscope. As a result, it was found that the reflective and conductive layer (Ag film) is substantially uniform all over the mirror finished surface of the substrate base member, the distance between the bottom of the concave portions and the summit of the convex portions is 0.6 to 0.7 μm, and the mean distance between the adjacent convex portions is about 1.0 μm.

Then, using the same planar type DC magnetron sputtering apparatus as used in the formation of the reflective and conductive layer 102, the buffer layer 103 was formed on the previously formed reflective and conductive layer 102 in the following manner.

That is, as the target, a target comprising zinc oxide of 99.99% purity was used. This target was subjected to sputtering while maintaining the substrate base member at 300° C. and feeding Ar gas and $O_2$ gas as the sputtering gas at respective flow rates of 25 sccm and 0.1 sccm, under the conditions of 5 mTorr for the sputtering pressure, 0.8 A for the sputtering electric current and 170 Å/min. for the deposition rate, to thereby form an about 1 μm thick film comprising zinc oxide as the buffer layer 103. The film formation in this case was performed while intermittently moving the heating plate 403 at a 20 second periodic cycle such that the normal line at the center of the substrate member 408 establishes an apparent circular cone-like side face of a 35° apex angle, by operating the driving system 402 supporting the heating plate 403 having the substrate member 408 thereon.

The surface of the buffer layer 103 was observed by an electron microscope. As a result, it was found that the buffer layer 103 is substantially uniform all over the surface of the reflective and conductive layer 102, the distance between the bottom of the concave portions and the summit of the convex portions is 0.7 to 0.8 μm, and the mean distance between the adjacent convex portions is about 1.0 μm.

Then, the cross section of the buffer layer 103 was observed by an electron microscope. As a result, it was found that the mean ratio between the thickness of the convex portions and the thickness of the concave portions of the irregularities of the buffer layer is 2.5.

Using the reflective solar cell substrate thus obtained, a solar cell module of the configuration shown in FIG. 5 was prepared, having sixteen amorphous silicon solar cell units respectively of the constitution shown in FIG. 2 and of 1 cm² in area arranged as shown in FIG. 5.

For comparison purposes, the above procedures were repeated, except that in the process of forming the buffer layer 103, layer formation was performed without operating the driving system 402, wherein the substrate member was maintained directly opposite the target, to thereby obtain a comparative reflective solar cell substrate.

Using this comparative reflective solar cell substrate, a comparative solar cell module of the same kind as described above was prepared.

For each of the resultant two solar cell modules, the photoelectric conversion efficiency was measured in the same manner as in Experiment 1. Further, the open circuit voltage and short circuit current were measured in accordance with a conventional method.

As a result, it was found that the solar cell module of the present invention surpasses the comparative solar cell module by a factor of 1.08 with respect to the open circuit voltage, a factor of 1.19 with respect to the short circuit current, and a factor of 1.31 with respect to the photoelectric conversion efficiency.

EXAMPLE 5

As the substrate base member 101, a stainless steel plate of SUS 304 (trade name) which is of 50 mm × 100 mm in area size and 0.08 mm in thickness and having a mirror finished surface was provided.

On the substrate base member 101 a reflective and conductive layer 102 and a buffer layer were formed in this order by repeating the corresponding procedures of Example 4.

The surface of the buffer layer 103 was observed by an electron microscope. As a result, it was found that the buffer layer 103 is substantially uniform all over the surface of the reflective and conductive layer 102, the distance between the bottom of the concave portions and the summit of the convex portions of the irregularities is 0.7 to 0.8 μm, and the mean distance between the adjacent convex portions is about 1.2 μm.

Then, the cross section of the buffer layer 103 was observed by an electron microscope. As a result, it was found that the mean ratio between the thickness of the convex portions and the thickness of the concave portions of the irregularities of the buffer layer is 2.4.

Using the reflective solar cell substrate thus obtained, ten solar cell modules of the configuration shown in FIG. 5 were prepared, having sixteen amorphous silicon solar cell units of the constitution shown in FIG. 2 and of 1 cm² in area arranged as shown in FIG. 5.

For each of the ten solar cell modules, output lead wires were fixed to each solar cell unit and both sides of the solar cell module were vacuum sealed by a protective film comprising tetrafluoroethylene-hexafluoropropylene copolymer (FEP).

The resultant solar cell modules were subjected to a durability test as follows.

Firstly, the proportion of the cell units which do not exhibit electrical leakage and which provide more than 90% of the maximum value of the open circuit voltage and fill factor (this proportion is called "survival rate") was observed at the initial stage by a conventional method, and found to be 98%. Then, each of the solar cell modules was subjected to a mechanical test where it was wound around a pipe of 10 mm diameter for a certain period of time, removed from the pipe, turned over and again wound around the pipe. This procedure was repeated 1000 times, after which, the survival rate was observed. As a result, it was 95%.

For comparison purposes, the above procedures were repeated except that in the process of forming the buffer layer 103, layer formation was performed without operating the driving system 402, whereby the substrate member was maintained directly opposite the target, to thereby obtain ten comparative solar cell modules.

For these comparative solar cell modules, the survival rate was observed at the initial stage and after the mechanical test as described above. As a result, it was found that the survival rate at the initial stage is 91% and 76% after the mechanical test.

From the above results, it was recognized that the reflective solar cell substrate according to the present invention surpasses the known reflective solar cell substrate.

As apparent from the above, the reflective solar cell substrates provided according to the present invention are characterized by having a specific buffer layer composed of a substantially translucent and conductive material selected from magnesium fluoride-containing materials, oxides, nitrides and carbides of at least one element selected from the group consisting of indium, tin, cadmium, zinc, antimony, silicon, chromium, silver, copper, aluminum and magnesium, said buffer layer being provided with specific irregularities at the surface thereof, said irregularities comprising a plurality of thickened convex portions and a plurality of thinned concave portions being alternately arranged with a thickness distribution that the mean ratio between the thickness of the thicker convex portions and the thickness of the thinner concave portions is 1.2 or more, and the mean distance between the adjacent thickened convex portions is in the range of 0.2 to 2.0 μm.

And, as is apparent from the results obtained in the above experiments and examples, the reflective solar cell substrate according to the present invention make solar cells prepared using it to be such that light reaching the substrate is reflected at an effective angle without being absorbed by the optically active layer thereby exhibiting improved photovoltaic characteristics, including an improved output current value and excellent power output characteristics.

Particularly, since the foregoing specific buffer layer is present between the substrate base member and the optically active layer (semiconductor layer), the solar cells excel especially in the open circuit voltage and fill factor, among other power output characteristics, and are free not only from occurrence of short circuits but also of increase in series resistance.

Thus, the solar cell provided with the above reflective substrate according to the present invention provides improved photoelectric conversion efficiency without being deteriorated even upon repeated use over a long period of time.

TABLE 1

| substrate | apex angle of the circular cone (degree) | the ratio between the thickness of the convex portion and the thickness of the concave portion in the buffer layer |
| --- | --- | --- |
| (a) | 0 | 1.00 |
| (b) | 5 | 1.12 |
| (c) | 8 | 1.20 |
| (d) | 10 | 1.27 |
| (e) | 12 | 1.35 |
| (f) | 15 | 1.45 |
| (g) | 20 | 1.64 |
| (h) | 30 | 2.00 |

TABLE 2

| substrate | scanning speed of the laser beam (μm/sec) | mean distance between the adjacent convex portions (μm) |
| --- | --- | --- |
| (i) | 5 | 0.10 |
| (j) | 6 | 0.12 |
| (k) | 7 | 0.14 |
| (l) | 9 | 0.18 |
| (m) | 11 | 0.21 |
| (n) | 18 | 0.37 |
| (o) | 28 | 0.56 |
| (p) | 42 | 0.84 |
| (q) | 70 | 1.41 |
| (r) | 100 | 2.05 |
| (s) | 146 | 2.90 |
| (t) | 172 | 3.45 |
| (u) | 200 | 3.98 |

What we claim is:

1. A solar cell substrate, comprising a base member having a surface portion composed of a metallic material provided with irregularities at the upper surface of said surface portion and a buffer layer disposed on said base member so as to entirely cover said irregularities, said buffer layer being composed of a substantially transparent or translucent and conductive material and provided with irregularities at the upper surface thereof, and said irregularities at said surface of said buffer layer comprising a plurality of thicker convex portions and a plurality of thinner concave portions, said portions being alternately arranged.

2. A solar cell substrate according to claim 1, wherein the mean ratio between the thickness of said thicker convex portions and the thickness of said thinner concave portions of said irregularities at the surface of said buffer layer is 1.2 or more.

3. A solar cell substrate according to claim 1, wherein said buffer layer is composed of a magnesium fluoride-containing material.

4. A solar cell substrate according to claim 1, wherein said buffer layer is composed of an oxide material containing at least one element selected from the group consisting of indium, tin, cadmium, zinc, antimony, silicon, chromium, silver, copper, aluminum, and magnesium.

5. A solar cell substrate according to claim 1, wherein said buffer layer is composed of a nitride material containing at least one element selected from the group consisting of indium, tin, cadmium, zinc, antimony, silicon, chromium, silver, copper, aluminum, and magnesium.

6. A solar cell substrate according to claim 1, wherein said buffer layer is composed of a carbide material containing at least one element selected from the group consisting of indium, tin, cadmium, zinc, antimony, silicon, chromium, silver, copper, aluminum, and magnesium.

7. A solar cell substrate according to claim 1, which further comprises a conductive layer disposed under said buffer layer, said conductive layer being composed of a conductive material containing at least one element selected from the group consisting of silicon, silver, aluminum, iron, copper, nickel, chromium, and molybdenum.

8. A solar cell substrate according to claim 1, wherein said base member comprises an insulating member and a reflective and conductive layer laminated on said insulating member.

9. A solar cell comprising an optically active layer formed of a thin film semiconductor and an overlying electrode disposed on a substrate, said substrate comprising a base member having a surface portion composed of a metallic material provided with irregularities at the upper surface of said surface portion and a buffer layer disposed on said base member so as to entirely cover said irregularities at said upper surface of said surface portion of said base member, said buffer layer being composed of a substantially transparent or translucent and conductive material and provided with irregularities at the upper surface thereof, and said irregularities at the surface of said buffer layer comprising a plurality of thicker convex portions and a plurality of thinner concave portions, said portions being alternately arranged.

10. A solar cell according to claim 9, wherein the mean ratio between the thickness of said thicker convex portions and the thickness of said thinner concave portions of said irregularities at said surface of said buffer layer is 1.2 or more.

11. A solar cell according to claim 9, wherein said buffer layer is composed of a magnesium fluoride-containing material.

12. A solar cell according to claim 9, wherein said buffer layer is composed of an oxide material containing at least one selected from the group consisting of indium, tin, cadmium, zinc, antimony, silicon, chromium, silver, copper, aluminum, and magnesium.

13. A solar cell according to claim 9, wherein said buffer layer is composed of an nitride material containing at least one element selected from the group consisting of indium, tin, cadmium, zinc, antimony, silicon, chromium, silver, copper, aluminum, and magnesium.

14. A solar cell according to claim 9, wherein said buffer layer is composed of an carbide material containing at least one element selected from the group consisting of indium, tin, cadmium, zinc, antimony, silicon, chromium, silver, copper, aluminum, and magnesium.

15. A solar cell according to claim 9, wherein said substrate further comprises a conductive layer being disposed under said buffer layer, said conductive layer being composed of a conductive material containing at least one element selected from the group consisting of the group consisting of silicon, silver, aluminum, iron, copper, nickel, chromium, and molybdenum.

16. A solar cell according to claim 9, wherein said base member comprises an insulating member and a reflective and conductive layer laminated on said insulating member.

* * * * *

UNITED STATES PATENT AND TRADEMARK OFFICE
CERTIFICATE OF CORRECTION

PATENT NO. : 5,244,509
DATED : September 14, 1993
INVENTOR(S) : KOZO ARAO, ET AL.

It is certified that error appears in the above-identified patent and that said Letters Patent is hereby corrected as shown below:

ON TITLE PAGE

In [30] Foreign Application Priority Data:
"Aug. 9, 1990 [JP] Japan .... 212307" should read
--Aug. 9, 1990 [JP] Japan .... 2-212307--.

In [56] References Cited, under FOREIGN PATENT DOCUMENTS:
"59-153588 12/1979 Japan" should read
--54-153588 12/1979 Japan--.

COLUMN 2

Line 29, "disposit" should read --disposition of a barrier--.

COLUMN 3

Lines 10-65, "problems, it is necessary" etc. should be deleted.

COLUMN 4

Line 27, "the" should read --the concave portions. Thus, this solar cell is not satisfactory in view of preventing occurrence of short circuits throughout the solar cell.

In order to eliminate the above problem relating to occurrence of short circuits due to the irregularities at the surface of the substrate, it is effective to provide a transparent electrode of

UNITED STATES PATENT AND TRADEMARK OFFICE
CERTIFICATE OF CORRECTION

PATENT NO. : 5,244,509

DATED : September 14, 1993

INVENTOR(S) : KOZO ARAO, ET AL.

It is certified that error appears in the above-identified patent and that said Letters Patent is hereby corrected as shown below:

COLUMN 4

Line 27 (con't), such a thickness that makes it possible to prevent occurrence of short circuits in the solar cell. As a result of studies by the present inventors, it has been concluded that this idea is effective for the purpose of preventing the occurrence of short circuit but causes other problems. That it, in solar cells having a transparent electrode with such thickness, the electrical resistance of the transparent electrode in the thickness direction increases the series resistance of the solar cell, thereby negatively affecting the characteristics of the solar cell, particularly the open circuit voltage and fill factor. Because of this, the resulting solar cell is poor in photoelectric conversion efficiency.

SUMMARY OF THE INVENTION

The present inventors have made extensive studies in order to solve the foregoing problems in the known solar cells while focusing on the reflective substrate. As a result, it has been found that in order for a solar cell having a thin film semiconductor composed of a material having a large light absorption coefficient, such as an amorphous silicon material, to be free of the foregoing

UNITED STATES PATENT AND TRADEMARK OFFICE
CERTIFICATE OF CORRECTION

PATENT NO. : 5,244,509
DATED : September 14, 1993
INVENTOR(S) : KOZO ARAO, ET AL.

It is certified that error appears in the above-identified patent and that said Letters Patent is hereby corrected as shown below:

COLUMN 4

Line 27 (con't), problems, it is necessary to use as the reflective substrate a member which satisfies at least the following three items:

(1) reflects light reaching the substrate without being absorbed by the optically active layer at an effective angle, (2) serves to prevent occurrence of short circuits without causing a reduction in the open circuit voltage and the fill factor and also without causing a reduction in the yield due to occurrence of short circuits during the production process thereof, and (3) can be easily prepared at a reduced cost.

The present invention has been accomplished based on the above findings.

An object of the present invention is, therefore, to provide an improved reflective substrate provided with specific irregularities having a large difference of elevation which substantially reduce occurrence of short circuits when used as the reflective substrate of a solar cell.

UNITED STATES PATENT AND TRADEMARK OFFICE
CERTIFICATE OF CORRECTION

PATENT NO. : 5,244,509
DATED : September 14, 1993
INVENTOR(S) : KOZO ARAO, ET AL.

It is certified that error appears in the above-identified patent and that said Letters Patent is hereby corrected as shown below:

COLUMN 4

Line 27 (con't),

Another object of the present invention is to provide an improved reflective solar cell substrate which reflects light reaching the substrate without being absorbed by the optically active layer at an effective angle to thereby exhibit improved photovoltaic characteristics.

A further object of the present invention is to provide an improved solar cell provided with said reflective substrate which exhibits improved photovoltaic characteristics.--.

Line 59, "allow" should read --alloy--.

COLUMN 7

Line 37, "which" should read --which meets the above requirements.--.

COLUMN 8

Line 25, "one." should read --one- --.
Line 63, "scanning" should read --scanning of--.

COLUMN 9

Line 5, "to be" should read --is--.

UNITED STATES PATENT AND TRADEMARK OFFICE
CERTIFICATE OF CORRECTION

PATENT NO.   : 5,244,509
DATED        : September 14, 1993
INVENTOR(S)  : KOZO ARAO, ET AL.

It is certified that error appears in the above-identified patent and that said Letters Patent is hereby corrected as shown below:

COLUMN 9

Line 31, "It" should read --It should be understood that the following method is for--.
   Line 48, "an" should read --and--.
   Line 63, "speed" should read --speed.--.

COLUMN 10

Line 7, "to" should read --the--.

COLUMN 11

Line 7, "member 40" should read --member 408--.

COLUMN 14

Line 57, "1 cm$^3$" should read --1 cm$^2$--.

COLUMN 18

Line 26, "02. µm." should read --0.2 µm.--.

COLUMN 23

Line 24, "one" should read --one element--.

UNITED STATES PATENT AND TRADEMARK OFFICE
CERTIFICATE OF CORRECTION

PATENT NO. : 5,244,509
DATED : September 14, 1993
INVENTOR(S) : KOZO ARAO, ET AL.

It is certified that error appears in the above-identified patent and that said Letters Patent is hereby corrected as shown below:

COLUMN 24

Line 4, "an" should read --a--.
Line 9, "an" should read --a--.
Line 18, "the group consisting of" should be deleted.

Signed and Sealed this

Eleventh Day of October, 1994

Attest:

BRUCE LEHMAN

Attesting Officer

Commissioner of Patents and Trademarks